(12) United States Patent
Aritome

(10) Patent No.: US 7,534,681 B2
(45) Date of Patent: May 19, 2009

(54) MEMORY DEVICE FABRICATION

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 464 days.

(21) Appl. No.: 11/338,067

(22) Filed: Jan. 24, 2006

(65) Prior Publication Data

US 2007/0173018 A1    Jul. 26, 2007

(51) Int. Cl.
*H01L 21/336* (2006.01)
*H01L 21/3205* (2006.01)
*H01L 21/4763* (2006.01)

(52) U.S. Cl. .................. 438/257; 438/261; 438/589; 438/591

(58) Field of Classification Search .................. 438/257, 438/258, 259, 260–264, 587–594
See application file for complete search history.

(56) References Cited

U.S. PATENT DOCUMENTS

| | | | |
|---|---|---|---|
| 5,153,143 A * | 10/1992 | Schlais et al. ............... | 438/201 |
| 5,751,631 A | 5/1998 | Liu et al. | |
| 6,136,649 A | 10/2000 | Hui et al. | |
| 2002/0081796 A1 | 6/2002 | Han et al. | |
| 2004/0026748 A1 | 2/2004 | Goda et al. | |
| 2005/0009272 A1 | 1/2005 | Chen et al. | |

* cited by examiner

*Primary Examiner*—Chuogn A. Luu
(74) *Attorney, Agent, or Firm*—Leffert Jay & Polglaze, P.A.

(57) ABSTRACT

The invention provides methods of fabricating memory devices. One embodiment forms a bulk insulation layer overlying a plurality of source/drain regions formed in a substrate, removes a cap layer formed on each of a plurality of gate stacks formed on the substrate to expose an upper surface of each of the gate stacks, forms one or more contact holes in the bulk insulation layer to expose a portion of one or more of the source/drain regions, and forms control gates and one or more contacts concurrently by forming a conductive layer on the exposed upper surface of each of the gate stacks to form the control gates and in the one or more contact holes to form the one or more contacts.

119 Claims, 10 Drawing Sheets

MEMORY DEVICE FABRICATION

TECHNICAL FIELD OF THE INVENTION

The present invention relates generally to memory devices and in particular the present invention relates to memory device fabrication.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

NOR and NAND flash memory devices are two common types of flash memory devices, so called for the logical form of the basic memory cell configuration in which each is arranged. Typically, for NOR flash memory devices, the control gate of each memory cell of a row of the array is connected to a word line, and the drain region of each memory cell of a column of the array is connected to a bit line. The memory array for NOR flash memory devices is accessed by a row decoder activating a row of floating-gate memory cells by selecting the word line coupled to their gates. The row of selected memory cells then place their data values on the column bit lines by flowing a differing current, depending upon their programmed states, from a coupled source line to the coupled column bit lines.

The array of memory cells for NAND flash memory devices is also arranged such that the control gate of each memory cell of a row of the array is connected to a word line. However, each memory cell is not directly coupled to a column bit line by its drain region. Instead, the memory cells of the array are arranged together in strings (often termed NAND strings), typically of 32 each, with the memory cells coupled together in series, source to drain, between a source line and a column bit line. The memory array for NAND flash memory devices is then accessed by a row decoder activating a row of memory cells by selecting the word line coupled to a control gate of a memory cell. In addition, the word lines coupled to the control gates of unselected memory cells of each string are driven to operate the unselected memory cells of each string as pass transistors, so that they pass current in a manner that is unrestricted by their stored data values. Current then flows from the source line to the column bit line through each series coupled string, restricted only by the selected memory cells of each string. This places the current-encoded data values of the row of selected memory cells on the column bit lines.

The yield and cost of memory devices is generally a function of the number of fabrication steps. More fabrication steps increase the likelihood of device failure and increases fabrication times. Therefore, it is desirable to reduce the number of fabrication steps.

For the reasons stated above, and for other reasons stated below which will become apparent to those skilled in the art upon reading and understanding the present specification, there is a need in the art for alternative fabrication methods having fewer process steps.

SUMMARY

The above-mentioned problems with memory device fabrication and other problems are addressed by the present invention and will be understood by reading and studying the following specification.

For one embodiment, the invention provides a method of forming a memory device, including forming a bulk insulation layer overlying a plurality of source/drain regions formed in a substrate, removing a cap layer formed on each of a plurality of gate stacks formed on the substrate to expose an upper surface of each of the gate stacks, forming one or more contact holes in the bulk insulation layer to expose a portion of one or more of the source/drain regions, and forming control gates and one or more contacts concurrently by forming a conductive layer on the exposed upper surface of each of the gate stacks to form the control gates and in the one or more contact holes to form the one or more contacts.

Further embodiments of the invention include methods of varying scope.

DETAILED DESCRIPTION

Figure 1:
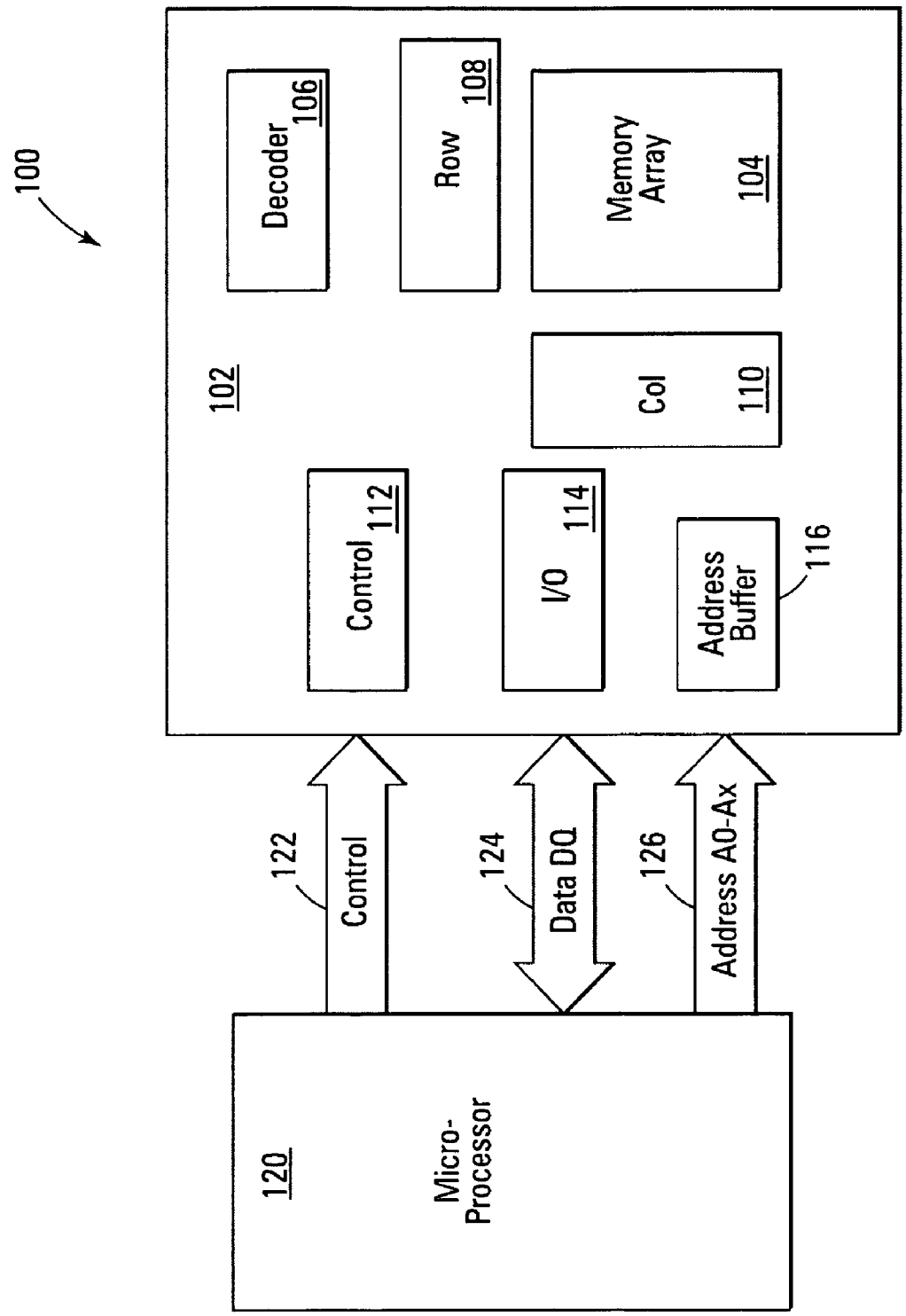
FIG. 1 is a simplified block diagram of a memory system, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Conventional fabrication methods for forming a NOR memory array often include forming contacts that connect drains of memory cells to bit lines and contacts for connecting sources of the memory cells to source lines using a process step that is independent of a process step for forming at least a portion of the word lines. This often results in extra fabrication steps. For NOR memory devices, logic devices, e.g., of row access circuitry and column access circuitry of the memory device are often disposed about a periphery of the NOR memory array. The logic devices often include field-effect transistors. The field-effect transistors are often formed concurrently with the memory cells. However, at least a portion of the control gates of the field-effect transistors and memory cells is formed using a process step that is independent of a process step for forming the contacts that connect drains of a memory cell to bit lines and sources of memory cells to source lines. This often results in extra fabrication steps.

For NAND memory devices, field-effect transistors are often connected on either end of the NAND strings and used as select gates. A source of one of the select gates is connected directly to a source line or to a source line contact that is connected to the source line, and a drain of the other select gate is connected to a bit line via a contact. Conventional fabrication methods for forming a NAND memory array often include forming the contact(s) and/or the source line using a process step that is independent of a process step for forming at least a portion of the word lines and at least a portion of the control gates (or select lines) of the select gates. This often results in extra fabrication steps.

FIG. 1 is a simplified block diagram of a memory system 100, according to an embodiment of the invention. Memory system 100 includes an integrated circuit, such as a flash memory device 102, e.g., a NAND or a NOR memory device, that includes an array of flash memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention. The memory cells of the array 104 and periphery devices, such as row access circuitry 108, column access circuitry 110 of memory 102, etc., are formed in accordance with the invention.

Figure 2:
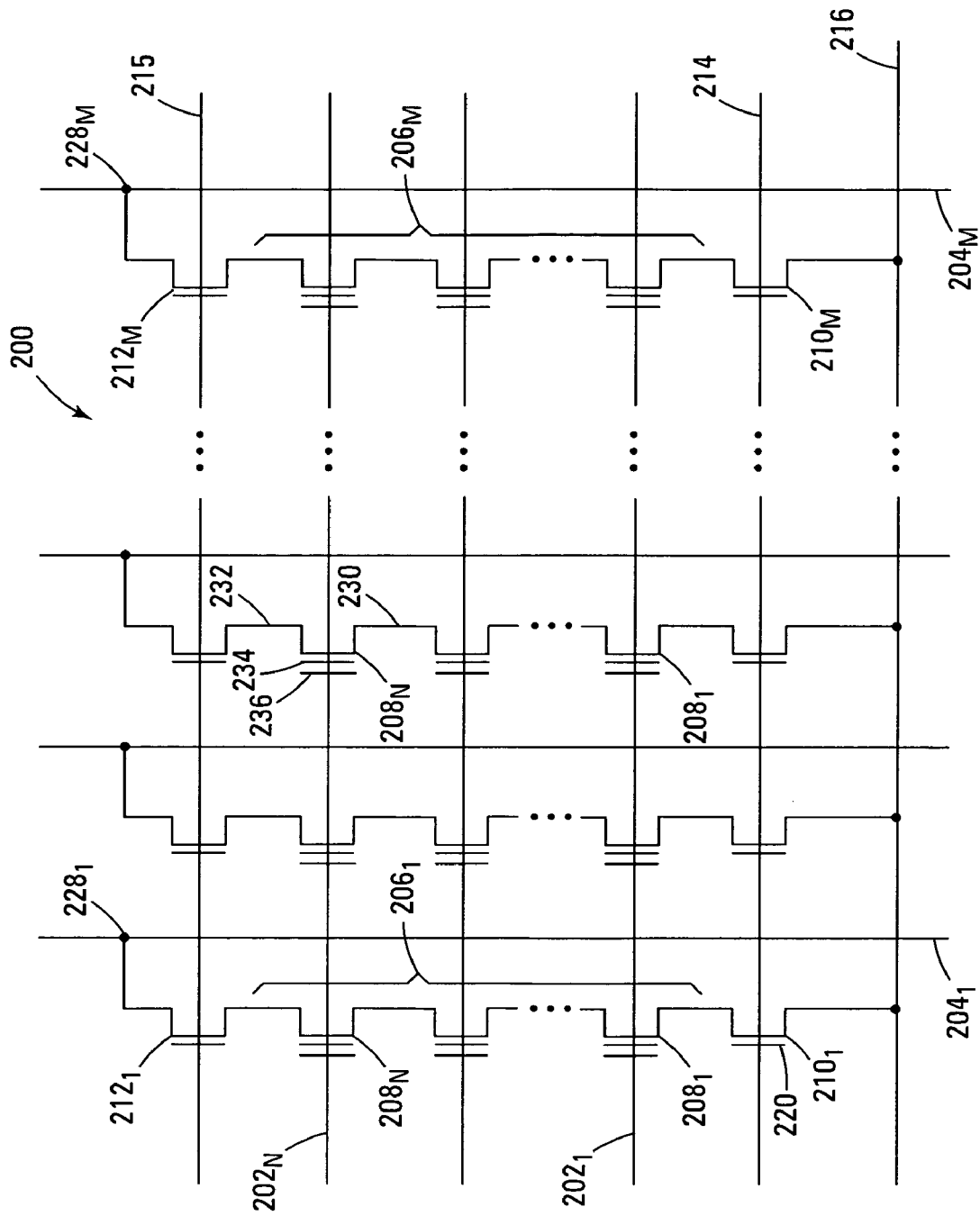
FIG. 2 is a schematic of a NAND memory array in accordance with another embodiment of the invention.

FIG. 2 illustrates a NAND memory array 200 as a portion of memory array 104 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series, source to drain, between a source select line 214 and a drain select line 215. Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the floating-gate transistors 208 of each NAND string 206 are connected between a source select gate 210 and a drain select gate 212.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. Each source select gate 210 includes a control gate 220.

The drain of each drain select gate 212 is connected to the local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of memory array 200 includes a NAND string 206 and the source and drain select gates connected thereto. A row of the floating-gate transistors 208 are those transistors commonly coupled to a given word line 202.

Figure 3A:
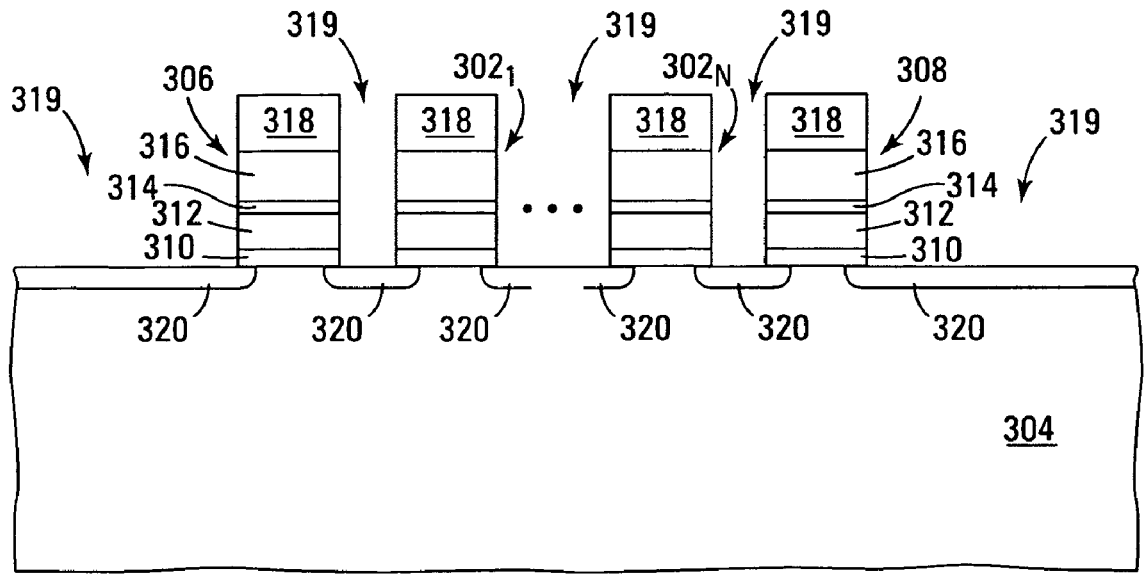
FIGS. 3A-3H are cross-sectional views of a portion of a memory array during various stages of fabrication in accordance with another embodiment of the invention.

FIGS. 3A-3H generally depict a method of forming a portion of a memory array of a NAND flash memory device in accordance with an embodiment of the invention. FIG. 3A depicts a portion of the memory array after several processing steps have occurred. Formation of the structure depicted in FIG. 3A is well known and will not be detailed herein. In general, FIG. 3A depicts a string of gate stacks $302_1$ to $302_N$ connected in series on a semiconductor substrate 304, such as a silicon-containing substrate, e.g., a monocrystalline silicon substrate, P-type monocrystalline silicon substrate, etc., between a gate stack 306 and a gate stack 308. A cap (or hard mask) layer 318 is formed over gate stacks $302_1$ to $302_N$, gate stack 306, and gate stack 308.

The structure of FIG. 3A is formed by forming a dielectric layer 310, such as oxide layer that can be blanket deposited or thermally grown on substrate 304. A conductive layer 312, e.g., of polysilicon (polycrystalline silicon) or other doped or undoped silicon materials, such as monocrystalline silicon, nanocrystalline silicon, and amorphous silicon layer, is formed overlying dielectric layer 310. A dielectric layer 314 is formed overlying conductive layer 312. For one embodiment, dielectric layer 314 may be one or more layers of dielectric material. For example, dielectric layer 314 could be of a multi-layer dielectric material commonly referred to as ONO (oxide-nitride-oxide). Other dielectric materials may be substituted for the ONO, such as tantalum oxide, barium strontium titanate, silicon nitride, and other materials providing dielectric properties. A conductive layer 316, e.g., of polysilicon, such as conductively-doped polysilicon is formed overlying dielectric layer 314. Note that dielectric layer 310, conductive layer 312, dielectric layer 314, and conductive layer 316 form gate stacks $302_1$ to $302_N$, gate stack 306, and gate stack 308. Cap layer 318, such as a layer of silicon nitride, is formed overlying conductive layer 316.

Cap layer 318 is patterned to define areas of cap layer 318 and areas of underlying conductive layer 316, dielectric layer 314, conductive layer 312, and dielectric layer 310 for removal. The areas of cap layer 318, conductive layer 316, dielectric layer 314, conductive layer 312, and dielectric layer 310 defined for removal are subsequently removed, e.g., by etching, to form areas 319 that expose portions of substrate 304 to define separate gate stacks 302, 306, and 308. Subsequently, source/drain regions 320 are formed in substrate 304.

Figure 3B:
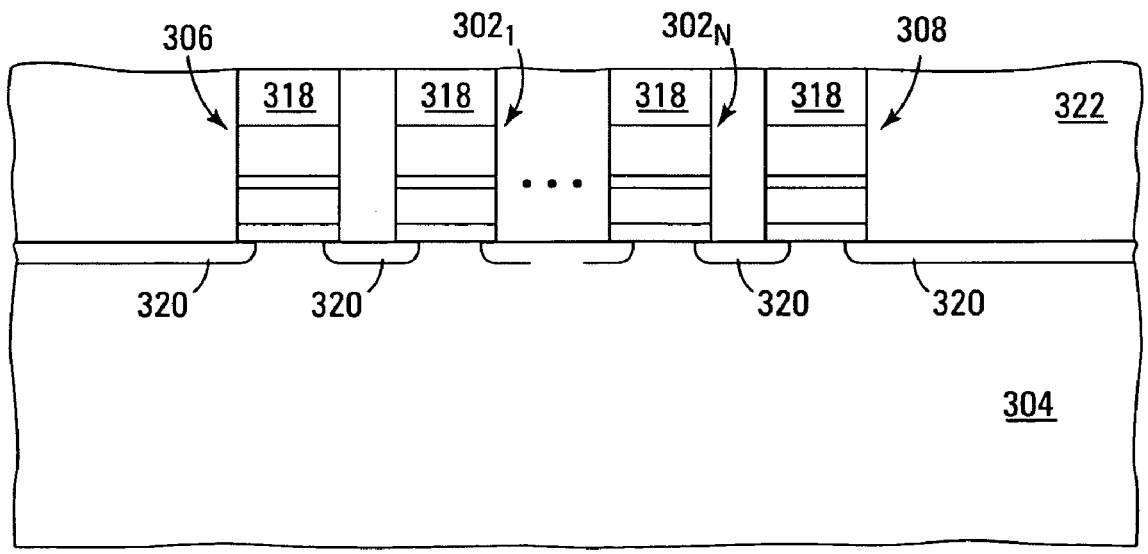

A bulk insulation layer (or another dielectric layer) 322 is formed overlying the structure of FIG. 3A in FIG. 3B that may be followed by removal of excess portions of insulation layer 322, e.g., by chemical mechanical planerization (CMP), stopping on cap layer 318 so that insulation layer 322 fills areas 319 and so that an upper surface of insulation layer 322 is substantially flush with upper surfaces of cap layer 318. One example for the insulation layer 322 would be a doped silicate glass. Examples of doped silicate glasses include BSG (borosilicate glass), PSG (phosphosilicate glass), and BPSG (borophosphosilicate glass). Another example for the insulation layer 322 would be TEOS (tetraethylorthosilicate).

Figure 3C:
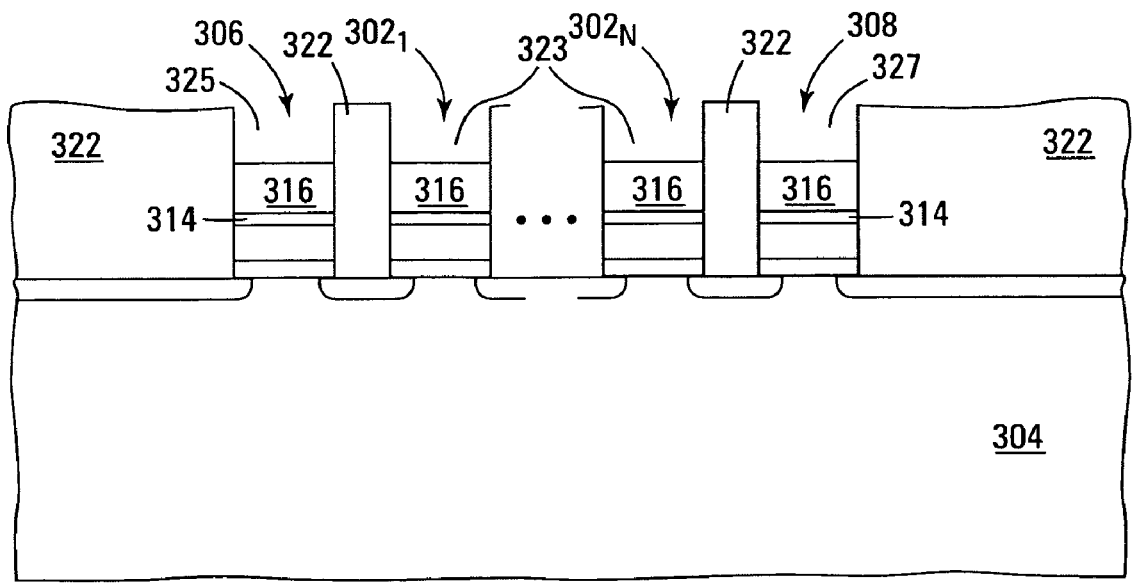

Cap layer 318 is removed in FIG. 3C to form recesses 323 exposing gate stacks 302 and recesses 325 and 327 respectively exposing gate stacks 306 and 308, and more specifically, conductive layer 316 of each of these gate stacks. A mask layer (not shown), e.g., an imaging resist layer, such as a layer of photo resist, is formed overlying the structure of FIG. 3C and is subsequently patterned for removing conductive layer 316 and dielectric layer 314 from each of gate stacks 306 and 308, e.g., by etching, to form gate stacks 330 and 332 in FIG. 3D that include conductive layer 312 and dielectric layer 310. This increases the depth of recesses 325 and 327 and exposes conductive layer 312.

Figure 3D:
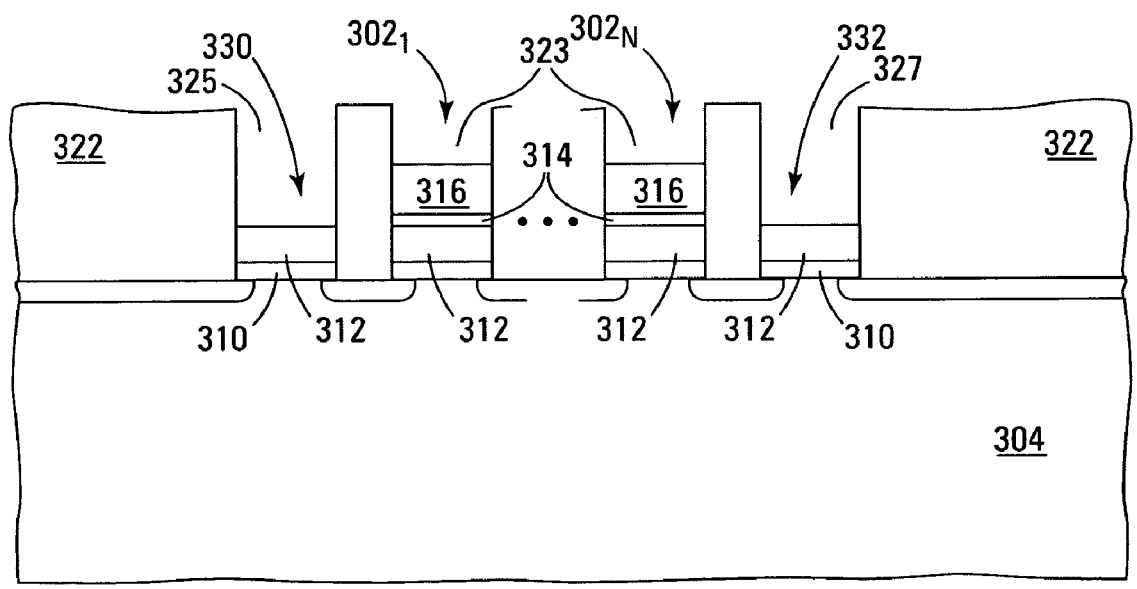

A mask layer 340, e.g., an imaging resist layer, is formed overlying the structure of FIG. 3D and is patterned for defining areas of remaining insulation layer 322 for removal. The areas of remaining insulation layer 322 defined for removal are removed, e.g., by etching, for forming a contact hole 342 that exposes a source/drain region 320 and a contact hole 344, such as a drain-line contact region, that that exposes a source/drain region 320 in FIG. 3E. For some embodiments, a slot or a trench may be formed in place of contact hole 342. The slot exposes source/drain regions for multiple columns.

Figure 3E:
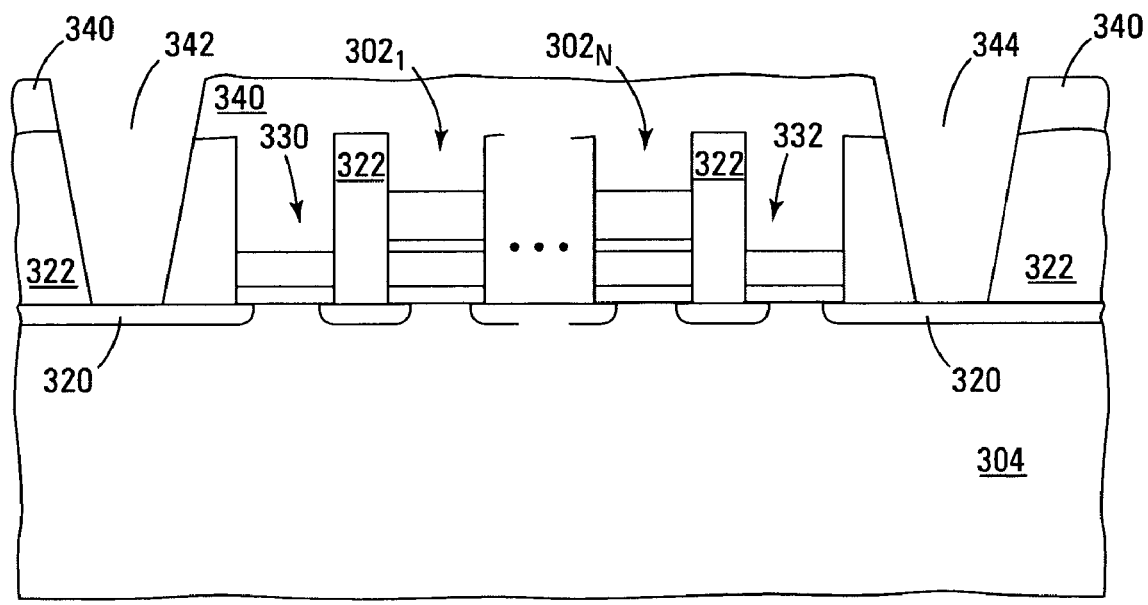
Figure 3F:
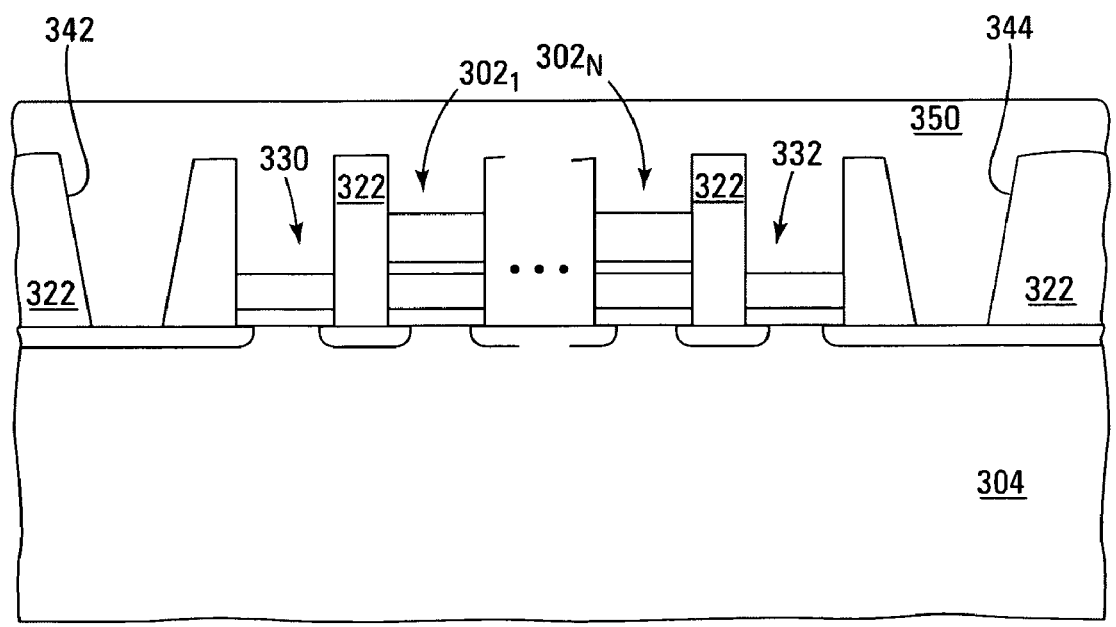

The remaining portion of mask layer 340 is removed from the structure of FIG. 3E and a conductive layer 350 is formed as a blanket deposition overlying the resulting structure in FIG. 3F. Conductive layer 350 over fills contact holes 342 and 344 and recesses 323 overlying gate stacks 302, recess 325 overlying gate stack 330, and recess 327 overlying gate stack 332. Conductive layer 350 may be formed using chemical vapor deposition (CVD) or physical vapor deposition (PVD) techniques. For one embodiment, conductive layer 350 is a metal or metal-containing layer and may be aluminum, copper, a refractory metal, or a refractory metal silicide layer. The metals of chromium (Cr), cobalt (Co), hafinium (Hf), molybdenum (Mo), niobium (Nb), tantalum (Ta), titanium (Ti), tungsten (W), vanadium (V) and zirconium (Zr) are generally recognized as refractory metals. For another embodiment, conductive layer 350 may contain multiple metal-containing layers, e.g., a titanium nitride (TiN) barrier layer overlying a source drain region 320, conductive layer 316, or conductive layer 312, a titanium (Ti) adhesion layer overlying the barrier layer, and a tungsten (W) layer overlying the adhesion layer.

Subsequently, a portion of conductive layer 350 is removed, e.g., by chemical mechanical planerization (CMP) in FIG. 3G. A remaining portion of conductive layer 350 forms a contact 360, such as a source-line contact in contact hole 342 and a contact 362, such as a drain-line contact, in contact hole 344. Note that for embodiments where contact hole 342 is replaced by a slot, filling the slot with conductive layer 350 forms a source line.

Remaining portions of conductive layer 350 also overlie gate stacks 330 and 332 to respectively form a source select gate 364 and a drain select gate 366, e.g., field effect transistors. Therefore, source select gate 364 and a drain select gate 366 each include dielectric layer 310 as a gate dielectric layer and conductive layer 312 and conductive layer 350 as a control gate. Note that the control gate of source select gate 364 forms a portion of a source select line, and the control gate of drain select gate 366 forms a portion of a drain select line.

Remaining portions of conductive layer 350 also overlie each of gate stacks 302 to respectively form memory cells 368, e.g., floating-gate memory cells, such as floating-gate transistors. Therefore, each of memory cells 368 includes dielectric layer 310 as a tunnel dielectric layer, conductive layer 312 as a floating-gate layer, dielectric layer 314 as an intergate dielectric layer, and conductive layer 316 and conductive layer 350 as a control gate (or word line). Note that contacts 360 and 362 and the metal or metal-containing portions of the source and drain select lines and word lines are formed substantially concurrently by the formation of conductive layer 350. This acts to reduce the number of process steps compared to conventional methods where source and drain select lines are formed in a separate step from the word lines.

Figure 3G:
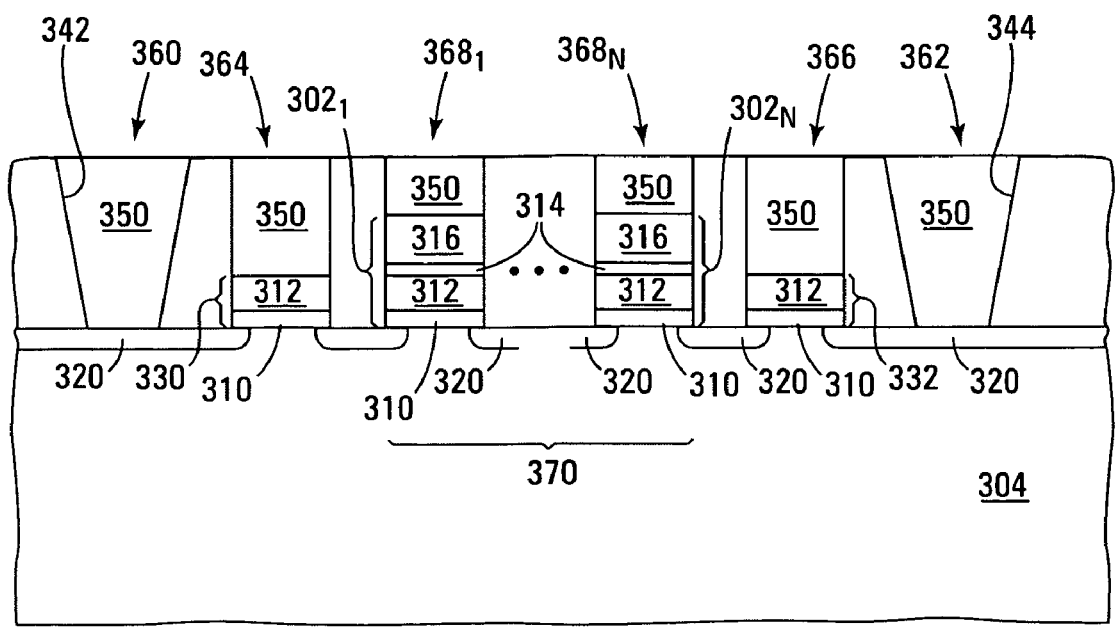

Successive memory cells 368 share one of source/drain regions 320 and are connected in series, source-to-drain, to form a NAND string 370 of memory cells, as shown in FIG. 3G. Source select gate 364 is connected to contact 360 by a source/drain region 320. Source select gate 364 is connected to NAND string 370 by a source/drain region 320 shared by source select gate 364 and memory cell $368_1$. Drain select gate 366 is connected to drain-line contact 362 by a source/drain region 320. Drain select gate 366 is connected to NAND string 370 by a source/drain region 320 shared by drain select gate 366 and memory cell $368_N$.

Figure 3H:
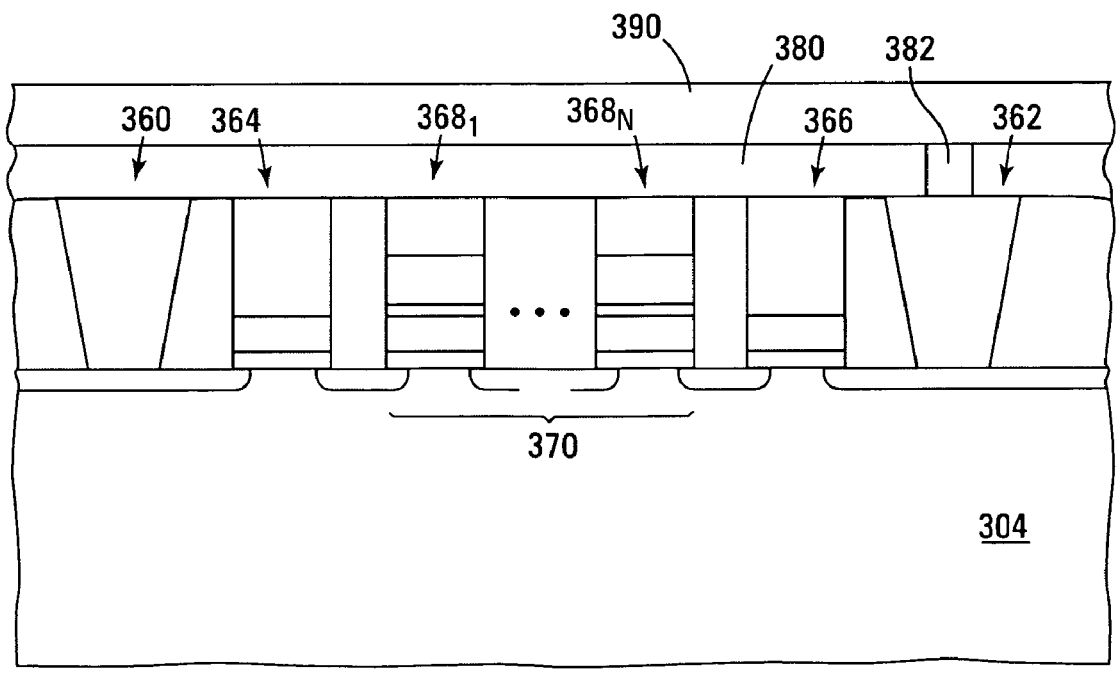

In FIG. 3H, a dielectric layer 380 is formed on the structure of FIG. 3G. A contact (or via plug) 382, such as a bit-line contact, is then formed through dielectric layer 380 in direct contact with contact 362, e.g., by CVD. Dielectric layer 380 may be of a dielectric material, such as silicon oxides, TEOS, silicon nitrides, or silicon oxynitrides. For one embodiment, formation of via plug 382 includes patterning a mask layer (not shown) overlying dielectric layer 380, followed by the formation of a hole passing through dielectric layer 380 by removal of a portion of dielectric layer 380, e.g., by etching, defined for removal by the patterning to expose a portion of contact 362. For one embodiment, via plug 382 may include one or more refractory metals. For another embodiment, via plug 382 may include a barrier layer, such as TiN, in contact with drain contact 362, a first metal layer, such as titanium (Ti), on the barrier layer, a second metal layer, such as tungsten (W), on the first metal layer.

Subsequently, a conductive layer 390 that may be a metal layer, such as aluminum, is deposited on dielectric layer 380 in electrical contact with via plug 382, e.g., using CVD. Conductive layer 390 is patterned, etched, and processed, e.g., using standard processing, to produce individual bit lines therefrom. For other embodiments, contact 360 may be connected to a metal layer using a contact, such as is described and shown, in FIG. 3H, for connecting contact 362 to conductive layer 390 using via plug 382. In these embodiments, the metal layer would function as a common source line.

FIGS. 3A-3H correspond to one of the columns of NAND memory array 200 of FIG. 2. Note that each of the columns of NAND memory array 200 of FIG. 2 may be formed according to the method depicted in FIGS. 3A-3H, where successive columns are electrically isolated from each other by isolation regions, such as shallow trench isolation (STI) regions. It is noted that the method depicted in FIGS. 3A-3H may be used to form a NOR-type memory device with any differences being discussed below.

Figure 4:
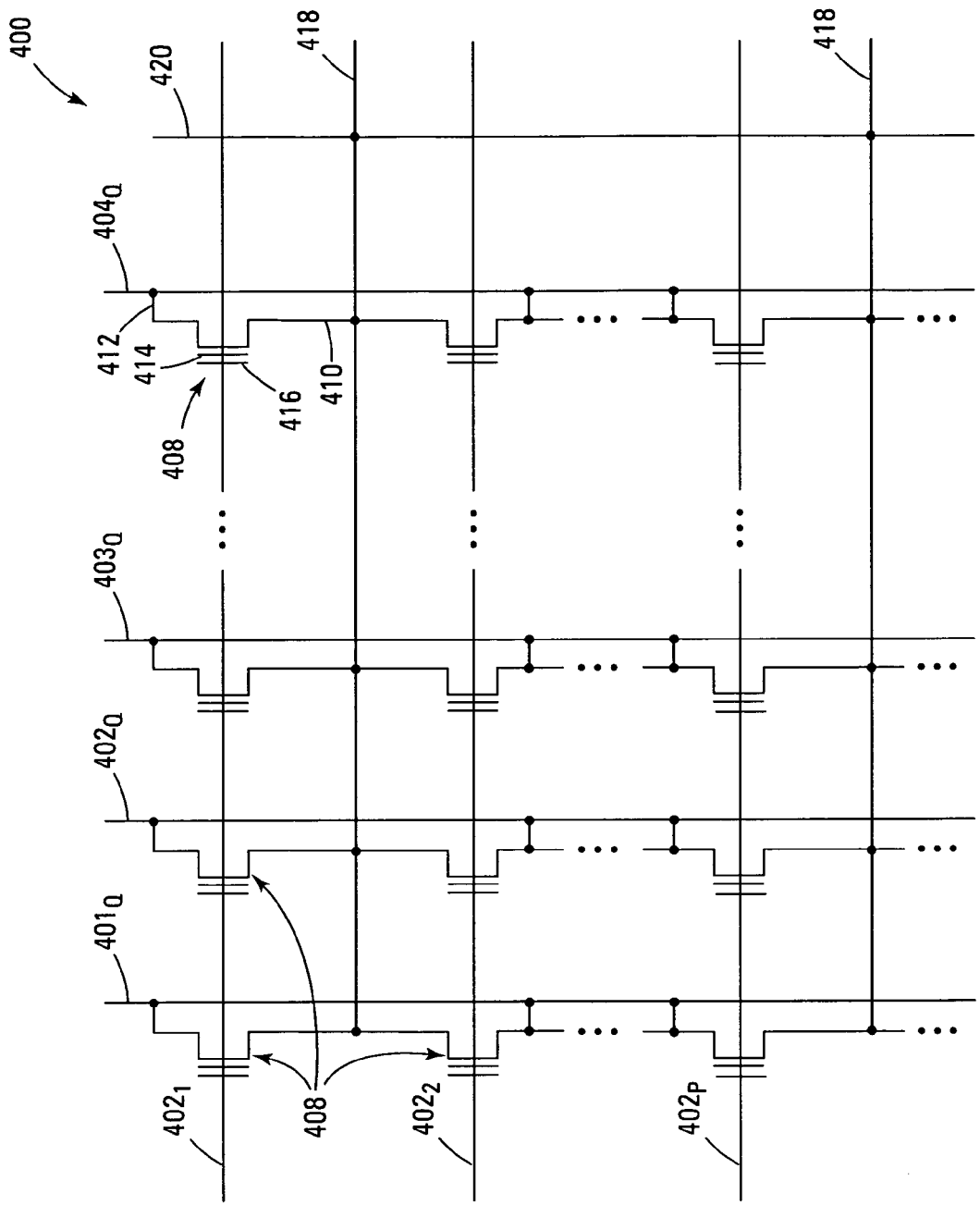
FIG. 4 is a schematic of a NOR memory array in accordance with another embodiment of the invention.

FIG. 4 illustrates a NOR memory array 400 as a portion of memory array 104 of FIG. 1 in accordance with another embodiment of the invention. Memory array 400 includes word lines $402_1$ to $402_P$ and intersecting local bit lines $404_1$ to $404_Q$. For ease of addressing in the digital environment, the number of word lines 402 and the number of bit lines 404 are each some power of two, e.g., 256 word lines 402 by 4,096 bit lines 404. The local bit lines 404 are coupled to global bit lines (not shown) in a many-to-one relationship.

Floating-gate transistors 408 are located at each intersection of a word line 402 and a local bit line 404. The floating-gate transistors 408 represent non-volatile memory cells for storage of data. Typical construction of such floating-gate transistors 408 include a source 410 and a drain 412 constructed from an N+-type material of high impurity concentration formed in a P-type semiconductor substrate of low impurity concentration, a channel region formed between the source 410 and drain 412, a floating gate 414, and a control gate 416.

Floating-gate transistors 408 having their control gates 416 coupled to a word line 402 typically share a common source depicted as array source 418. As shown in FIG. 4, floating-gate transistors 408 coupled to two adjacent word lines 402 may share the same array source 418. Floating-gate transistors 408 have their drains 412 coupled to a local bit line 404. A column of the floating-gate transistors 408 includes those transistors commonly coupled to a given local bit line 404. A row of the floating-gate transistors 408 includes those transistors commonly coupled to a given word line 402.

To reduce problems associated with high resistance levels in the array source 418, the array source 418 is regularly coupled to a metal or other highly conductive line to provide a low-resistance path to ground. The array ground 420 serves as this low-resistance path.

Figure 5:
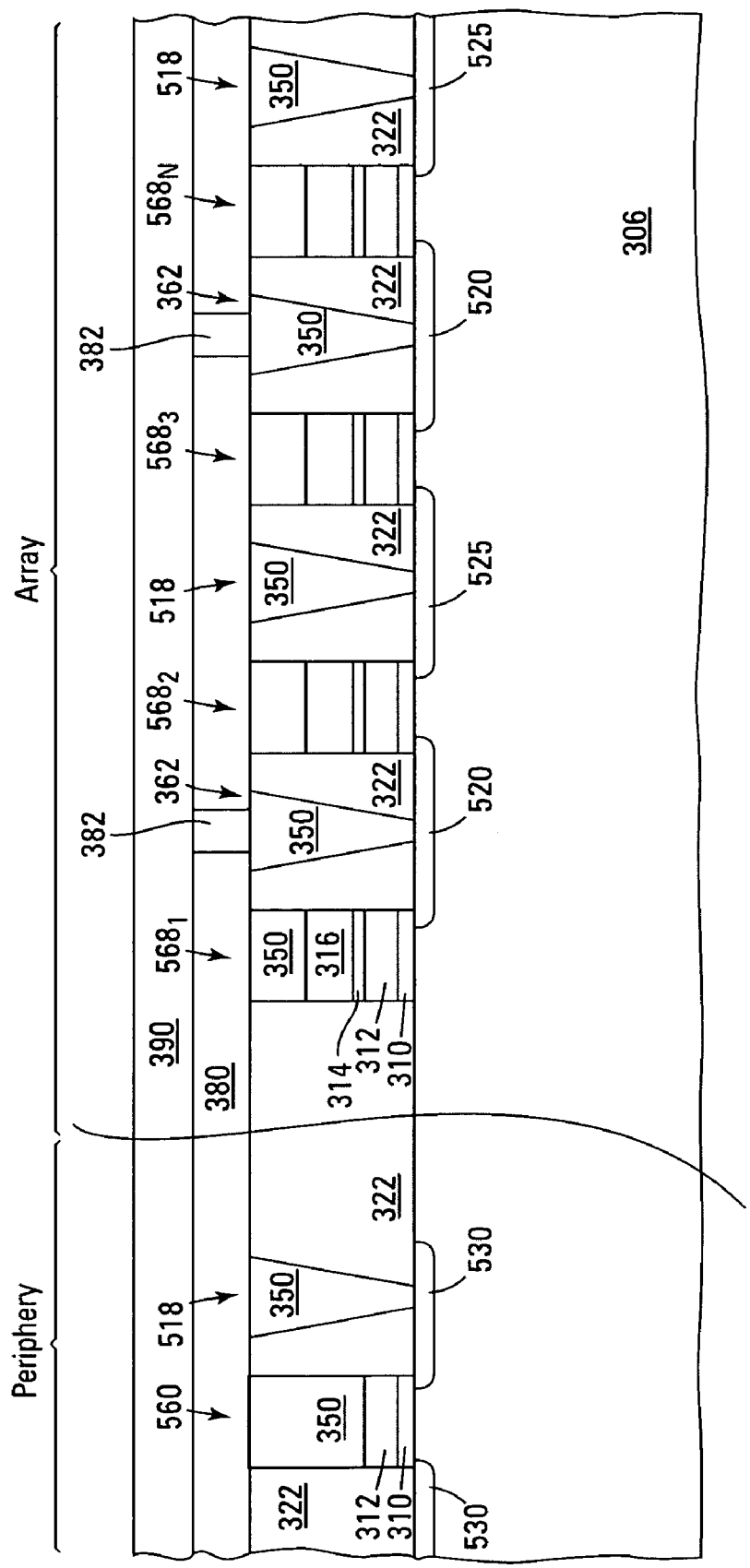
FIG. 5 is a cross-section of a portion of a memory device formed according to embodiments of the invention.

FIG. 5 is a cross-section of a portion of a memory device, such as memory device 102 of FIG. 1, e.g., a NOR memory device, formed according to the method depicted in FIGS. 3A-3H, in accordance with another embodiment of the invention. Elements common to FIGS. 3A-3H and FIG. 5 are denoted by common reference numbers. The memory device of FIG. 5 includes an array portion where an array of memory cells 568, e.g., floating gate memory cells, such as of memory array 104 of memory device 102 of FIG. 1, has been formed. The memory device of FIG. 5 further includes a periphery having a field-effect transistor 560, as a portion of a periphery device, e.g., of row access circuitry 108 or column access circuitry 110 of memory 102 of FIG. 1. It will be appreciated by those skilled in the art that various integrated circuit devices include passive elements, such as capacitors, and active elements, such as transistors, and that for some embodiments such active and passive elements are formed in the periphery.

Each of memory cells 568 includes dielectric layer 310 formed overlying substrate 304, conductive layer 312 formed overlying dielectric layer 310, dielectric layer 314 formed overlying conductive layer 312, conductive layer 316 formed overlying dielectric layer 314, and conductive layer 350 formed overlying conductive layer 316. Drain regions 520 and source regions 525 are formed in substrate 304. Pairs of adjacent memory cells 568, e.g., memory cells $568_1$ and $568_2$ and memory cells $568_3$ and $568_N$, share a drain region 520. Pairs of adjacent memory cells 568, e.g., memory cells $568_2$ and $568_3$, share a source 525. Field effect transistor 560 includes dielectric layer 310 formed overlying substrate 304, conductive layer 312 formed overlying dielectric layer 310, and metal or metal containing layer 350 formed overlying conductive layer 312.

Contacts 362 are formed in contact holes of bulk insulation layer 322 from conductive layer 350 and are in contact with drain regions 520. Each contact 362 also contacts a via plug 382 that passes through dielectric layer 380, formed overlying the array portion and the periphery, and that is in contact with a conductive layer 390 from which individual bit lines are formed, as described above in conjunction with FIG. 3H. Contacts 518, such as source contacts, are formed in contact holes in bulk insulation layer 322 from conductive layer 350 and are in contact with source regions 525 and are located between source regions 525 and dielectric layer 380.

Note that for some embodiments, contacts 518 may be replaced with lines, such as source lines or array sources, such as array sources 418 in FIG. 4, in which case the lines are formed in slots (or trenches) in bulk insulation layer 322 from conductive layer 350. Note that for one embodiment, source/drain regions 530 may also be formed in the periphery for field-effect transistor 560, and a contact 518 may be formed in insulation layer 322 from conductive layer 350 in contact with one of source/drain regions 530, as shown in FIG. 5.

Note that a portion of the control gate (or word line) of each of memory cells 568, a portion of the control gate of field-effect transistor 560, and contacts 362 and 518 are formed substantially concurrently from conductive layer 350, as described above.

Figure 6A:
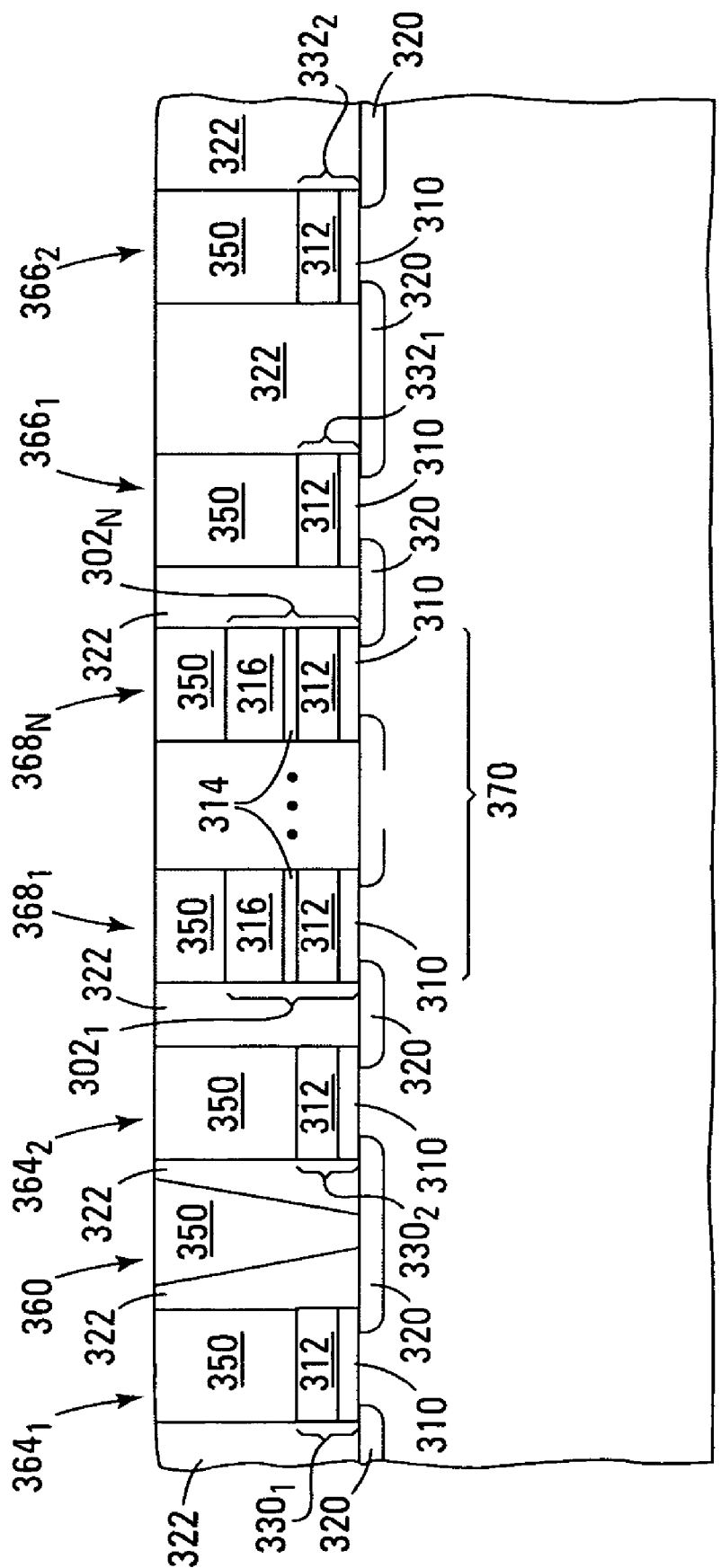
FIGS. 6A-6B are cross-sectional views of a portion of a memory array during various stages of fabrication in accordance with another embodiment of the invention.
Figure 6B:
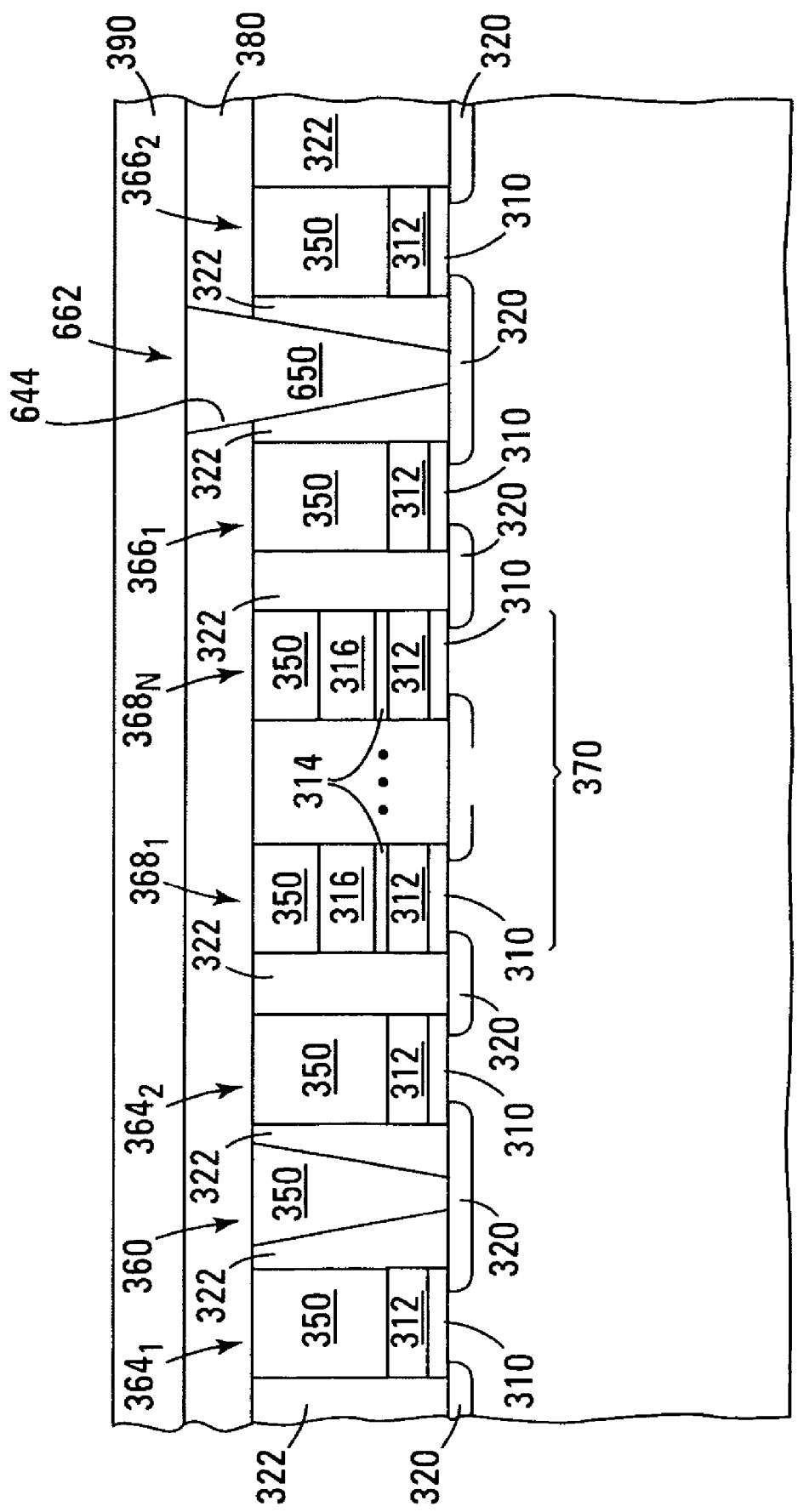

FIGS. 6A-6B generally depict a method of forming a portion of a memory array of a NAND flash memory device in accordance with another embodiment of the invention. Common reference numbers denote common elements in FIGS. 6A-6B and FIGS. 3G-3H. The structure of FIG. 6A may be formed as described above in conjunction with FIGS. 3A-3G, excluding the formation of contact hole 344, as shown in FIG. 3E, and contact 362 within contact hole 344, as shown in FIGS. 3F and 3G.

In FIG. 6B, dielectric layer 380 is formed on the structure of FIG. 6A. A mask layer (not shown), e.g., an imaging resist layer, is formed overlying dielectric layer 380 and is patterned for defining areas of dielectric layer 380 and of remaining insulation layer 322 for removal. The areas of dielectric layer 380 and of remaining insulation layer 322 defined for removal are removed, e.g., by etching, for forming a contact hole 644, such as a drain-line contact region, that passes through dielectric layer 380 and insulation layer 322 and exposes a source/drain region 320 in FIG. 6B. A conductive layer 650, e.g., substantially as described for conductive layer 350, is formed contact hole 644, e.g., using chemical vapor deposition (CVD) or physical vapor deposition (PVD) techniques to form a contact 662, such as a bit-line contact, in contact hole 644. Subsequently, conductive layer 390 is deposited on dielectric layer 380 in electrical contact with contact 662. Conductive layer 390 is patterned, etched, and processed, e.g., using standard processing, to produce individual bit lines therefrom.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a memory device, the method comprising:
    forming a bulk insulation layer overlying a plurality of source/drain regions formed in a substrate;
    removing a cap layer formed on each of a plurality of gate stacks formed on the substrate to expose an upper surface of each of the gate stacks;
    after removing the cap layer, forming a mask layer overlying the exposed upper surface of each of the gate stacks and the bulk insulation layer;
    patterning the mask layer to define one or more portions of the bulk insulation layer for removal;
    forming one or more contact holes in the bulk insulation layer to expose a portion of one or more of the source/drain regions by removing the one or more portions defined for removal; and
    forming control gates and one or more contacts concurrently by forming a conductive layer on the exposed upper surface of each of the gate stacks to form the control gates and in the one or more contact holes to form the one or more contacts.

2. The method of claim 1, wherein forming a conductive layer comprises a blanket deposition of the conductive layer.

3. The method of claim 1, wherein the bulk insulation layer is selected from the group consisting of doped silicate glass, borosilicate glass, phosphosilicate glass, borophosphosilicate glass, and TEOS.

4. The method of claim 1, wherein each of a portion of the plurality of source/drain regions is shared by adjacent pairs of gate stacks.

5. The method of claim 1, wherein a portion of the plurality of gate stacks with control gates thus formed are memory cells.

6. The method of claim 5, wherein at least one of the plurality of gate stacks with control gates thus formed is a select gate.

7. The method of claim 6, wherein at least one of the one or more of the source/drain regions exposed by the one or more contact holes is connected to the select gate.

8. The method of claim 5, wherein the memory cells are formed on an array portion of the substrate and wherein at least one of the plurality of gate stacks with control gates thus formed is an active element formed on a periphery of the substrate.

9. The method of claim 1, wherein the conductive layer is a first conductive layer and wherein each of a portion of the plurality of gate stacks, comprises:
    a first dielectric layer formed on the substrate;
    a second conductive layer formed on the first dielectric layer;
    a second dielectric layer formed on the second conductive layer; and
    a third conductive layer formed on the second dielectric layer.

10. The method of claim 9, wherein forming the first conductive layer on the exposed upper surface of each of the gate stacks comprises forming the first conductive layer on an upper surface of the third conductive layer of each of the portion of the plurality of gate stacks.

11. The method of claim 10, wherein
    the first dielectric layer forms a tunnel dielectric layer;
    the second conductive layer forms a floating gate layer;
    the second dielectric layer forms an interlayer dielectric layer; and
    the third conductive layer with the first conductive layer formed thereon forms the control gate of each of the portion of the plurality of gate stacks.

12. The method of claim 1, wherein the conductive layer is a first conductive layer and wherein at least one of the plurality of gate stacks, comprises:
    a first dielectric layer formed on the substrate; and
    a second conductive layer formed on the first dielectric layer.

13. The method of claim 12, wherein forming the first conductive layer on the exposed upper surface of each of the gate stacks further comprises forming the first conductive layer on an upper surface of the second conductive layer of the at least one of the plurality of gate stacks.

14. The method of claim 13, wherein
    the first dielectric layer forms a gate dielectric layer; and
    the second conductive layer with the first conductive layer formed thereon forms the control gate of the at least one of the plurality of gate stacks.

15. The method of claim 1, wherein the conductive layer is a metal or metal-containing layer selected from the group consisting of aluminum, copper, refractory metals, refractory metal silicides, and a layer having a metal-containing barrier layer, a metal-containing adhesion layer, and a metal layer.

16. The method of claim 1, wherein the one or more contacts are one or more source-line contacts or drain-line contacts.

17. The method of claim 1, wherein the conductive layer is a first conductive layer and further comprising:
    forming a dielectric layer overlying the control gates, the one or more contacts, and remaining portions of the bulk insulation layer;
    forming a second conductive layer on the dielectric layer; and forming one or more via plugs through the dielectric layer to electrically connect the one or more contacts to the second conductive layer.

18. The method of claim 17, wherein the second conductive layer is a metal layer.

19. The method of claim 1 wherein the one or more contact holes are one or more first contact holes, the one or more contacts are one or more first contacts, the one or more of the source/drain regions are one or more first source drain regions, and the conductive layer is a first conductive layer and further comprising:
   forming a dielectric layer overlying the control gates, the one or more first contacts, and remaining portions of the bulk insulation layer;
   forming a second contact hole through the dielectric layer and a portion of the remaining portions of the bulk insulation layer to expose a portion of a second source/drain region;
   forming a second contact in the second contact hole; and
   forming a second conductive layer on the dielectric layer and an exposed portion of the second contact to electrically connect the second conductive layer to the second contact.

20. The method of claim 19, wherein a portion of the plurality of gate stacks with control gates thus formed are memory cells.

21. The method of claim 20, wherein at least one of the plurality of gate stacks with control gates thus formed is a select gate.

22. The method of claim 21, wherein the portion of the second source/drain region exposed by the second contact hole is connected to the select gate.

23. A method of forming a NAND memory array, the method comprising:
   forming a string of series-connected first gate stacks on a substrate and second and third gate stacks connected to the string of first gate stacks at opposite ends of the string of first gate stacks;
   forming a bulk insulation layer to fill first areas separating successive first gate stacks, a second area separating the second gate stack and an adjacent first gate stack, a third area separating the third gate stack and an adjacent first gate stack, a fourth area overlying a first source/drain region in contact with the second gate stack, and a fifth area overlying a second source/drain region in contact with the third gate stack;
   removing a cap layer formed on each of the first, second, and third gate stacks to expose an upper surface of a first conductive layer of each of the first, second, and third gate stacks;
   forming a first contact hole in the bulk insulation layer of the fourth area to expose a portion of the first source/drain region; and
   forming control gates and a first contact concurrently by forming a second conductive layer on the exposed upper surface of the first conductive layer of each of the first, second, and third gate stacks to form the control gates and in the first contact hole to form the first contact, wherein the first contact is in electrical contact with the first source/drain region;
   wherein the first gate stacks with the control gates thus formed are a string of series-connected memory cells and the second and third gate stacks with the control gates thus formed are respectively first and second select gates.

24. The method of claim 23, wherein forming a second conductive layer comprises a blanket deposition of the second conductive layer.

25. The method of claim 23, wherein the bulk insulation layer is selected from the group consisting of doped silicate glass, borosilicate glass, phosphosilicate glass, borophosphosilicate glass, and TEOS.

26. The method of claim 23, wherein the second conductive layer is a metal or metal-containing layer selected from the group consisting of aluminum, copper, refractory metals, refractory metal silicides, and a layer having a metal-containing barrier layer, a metal-containing adhesion layer, and a metal layer.

27. The method of claim 23 further comprises:
   before forming the control gates and the first contact, forming a second contact hole in the bulk insulation layer of the fifth area to expose a portion of the second source/drain region; and
   forming a second contact in the second contact hole substantially concurrently with the control gates and the first contact by forming the second conductive layer in the second contact hole.

28. The method of claim 27 further comprises forming at least one third contact electrically connected between at least one of the first or second contacts and a third conductive layer.

29. The method of claim 28, wherein the third contact is a bit-line contact, the second contact is a drain-line contact, and the third conductive layer is a bit line, and wherein the bit-line contact electrically connects the drain-line contact to the bit line and thus the second source/drain region and thereby the second select gate and the string of memory cells to the bit line.

30. The method of claim 23 further comprises:
   forming a dielectric layer overlying the control gates, the first contact, the bulk insulation layer of the first, second, and third areas and a remaining portion of the bulk insulation layer of the fourth area;
   forming a second contact hole through the dielectric layer and the bulk insulation layer of the fifth area to expose a portion of the second source/drain region;
   forming a second contact in the second contact hole; and
   forming a third conductive layer on the dielectric layer and an exposed portion of the second contact to electrically connect the second conductive layer to the second contact.

31. The method of claim 30, wherein the second contact is a bit-line contact and the third conductive layer is a bit line, and wherein the bit-line contact electrically connects the second source/drain region to the bit line and thereby the second select gate and the string of memory cells to the bit line.

32. A method of forming a NAND memory array, the method comprising:
   forming a first dielectric layer on a semiconductor substrate;
   forming a first conductive layer on the first dielectric layer;
   forming a second dielectric layer on the first conductive layer;
   forming a second conductive layer on the second dielectric layer;
   forming a cap layer on the second conductive layer;
   removing portions of the cap layer, the second conductive layer, the second dielectric layer, the first conductive layer, and the first dielectric layer to form a plurality of areas that expose portions of the semiconductor substrate and define a plurality of first gate stacks disposed between a second gate stack and a third gate stack;

forming a plurality of source/drain regions in the exposed portions of the semiconductor substrate, wherein first source/drain regions of the plurality of source/drain regions connect the first gate stacks in series to form a string of series-connected first gate stacks, wherein a second source/drain region connects the second gate stack to an adjacent first gate stack at a first end of the string and a third source/drain region connects the third gate stack to an adjacent first gate stack at a second end of the string, opposite the first end, and wherein a fourth source/drain region is further connected to the second gate stack and a fifth source/drain region is further connected to the third gate stack;

forming a bulk insulation layer to fill first areas, of the plurality of areas, separating successive first gate stacks and corresponding to the first source/drain regions, a second area, of the plurality of areas, separating the second gate stack and its adjacent first gate stack and corresponding to the second source/drain region, a third area, of the plurality of areas, separating the third gate stack and its adjacent first gate stack and corresponding to the third source/drain region, a fourth area, of the plurality of areas, corresponding to the fourth source/drain region, and a fifth area, of the plurality of areas, corresponding to the fifth source/drain region;

removing portions of the cap layer remaining on each of the first, second, and third gate stacks to expose an upper surface of the second conductive layer of each of the first, second, and third gate stacks;

removing the second conductive layer and the second dielectric layer of second and third gate stacks to expose an upper surface of the first conductive layer of the second and third gate stacks;

forming a first contact hole in the bulk insulation layer of the fourth area to expose a portion of the fourth source/drain region and a second contact hole in the bulk insulation layer of the fifth area to expose a portion of the fifth source/drain region;

forming control gates and first and second contacts concurrently by forming a third conductive layer on the exposed upper surface of the second conductive layer of each of the first gate stacks to form a control gate of each of the first gate stacks, on the exposed upper surface of the first conductive layer of the second and third gate stacks to form a control gate of each of the second and third gate stacks, and in the first and second contact holes to respectively form the first and second contacts, wherein the first contact is in electrical contact with the fourth source/drain region and the second contact is in electrical contact with the fifth source/drain region, wherein the first gate stacks with the control gates thus formed form a string of series-connected memory cells and second and third gate stacks with the control gates thus formed are respectively first and second select gates;

forming a third dielectric layer overlying the first and second select gates, the memory cells, the contacts, and remaining portions of the bulk insulation layer;

forming a fourth conductive layer on the third dielectric layer; and forming a third contact through the third dielectric layer to electrically connect the second contact to the fourth conductive layer.

33. The method of claim 32, wherein the second dielectric layer is selected from the group consisting of one or more layers of dielectric material, tantalum oxide, barium strontium titanate, silicon nitride, and oxide-nitride-oxide.

34. The method of claim 32, wherein the first and second conductive layers are of polysilicon.

35. The method of claim 32, wherein the first dielectric layer is an oxide.

36. The method of claim 32, wherein the third dielectric layer is selected from the group consisting of silicon oxides, TEOS, silicon nitrides, and silicon oxynitrides.

37. The method of claim 32, wherein the fourth conductive layer is a metal layer.

38. The method of claim 32, wherein forming a third conductive layer comprises a blanket deposition of the third conductive layer.

39. The method of claim 32, wherein the bulk insulation layer is selected from the group consisting of doped silicate glass, borosilicate glass, phosphosilicate glass, borophosphosilicate glass, and TEOS.

40. The method of claim 32, wherein the third conductive layer is a metal or metal-containing layer selected from the group consisting of aluminum, copper, refractory metals, refractory metal silicides, and a layer having a metal-containing barrier layer, a metal-containing adhesion layer, and a metal layer.

41. The method of claim 32, wherein the first contact is a source-line contact, the second contact a drain-line contact, the third contact a bit-line contact, and the fourth conductive layer a bit line.

42. The method of claim 32, wherein forming control gates and first and second contacts further comprises removing a portion of the third conductive layer using chemical mechanical planerization.

43. The method of claim 32, wherein forming the third conductive layer comprises chemical vapor deposition or physical vapor deposition.

44. The method of claim 32, wherein
the first dielectric layer of each of the memory cells forms a tunnel dielectric layer;
the first conductive layer of each of the memory cells forms a floating gate layer;
the second dielectric layer of each of the memory cells forms an interlayer dielectric layer; and
the control gate of each of the memory cells comprises the second conductive layer and the third conductive layer.

45. The method of claim 44, wherein
the first dielectric layer of the first and second select gates forms a gate dielectric layer; and
the control gate of the first and second select gates comprises the first conductive layer and the third conductive layer.

46. The method of claim 32, wherein the memory cells are floating gate memory cells.

47. A method of forming a NAND memory array, the method comprising:
forming a first dielectric layer on a semiconductor substrate;
forming a first conductive layer on the first dielectric layer;
forming a second dielectric layer on the first conductive layer;
forming a second conductive layer on the second dielectric layer;
forming a cap layer on the second conductive layer;
removing portions of the cap layer, the second conductive layer, the second dielectric layer, the first conductive layer, and the first dielectric layer to form a plurality of areas that expose portions of the semiconductor substrate and define a plurality of first gate stacks disposed between a second gate stack and a third gate stack;

forming a plurality of source/drain regions in the exposed portions of the semiconductor substrate, wherein first source/drain regions of the plurality of source/drain regions connect the first gate stacks in series to form a string of series-connected first gate stacks, wherein a second source/drain region connects the second gate stack to an adjacent first gate stack at a first end of the string and a third source/drain region connects the third gate stack to an adjacent first gate stack at a second end of the string, opposite the first end, and wherein a fourth source/drain region is further connected to the second gate stack and a fifth source/drain region is further connected to the third gate stack;

forming a bulk insulation layer to fill first areas, of the plurality of areas, separating successive first gate stacks and corresponding to the first source/drain regions, a second area, of the plurality of areas, separating the second gate stack and its adjacent first gate stack and corresponding to the second source/drain region, a third area, of the plurality of areas, separating the third gate stack and its adjacent first gate stack and corresponding to the third source/drain region, a fourth area, of the plurality of areas, corresponding to the fourth source/drain region, and a fifth area, of the plurality of areas, corresponding to the fifth source/drain region;

removing portions of the cap layer remaining on each of the first, second, and third gate stacks to expose an upper surface of the second conductive layer of each of the first, second, and third gate stacks;

removing the second conductive layer and the second dielectric layer of second and third gate stacks to expose an upper surface of the first conductive layer of the second and third gate stacks;

forming a first contact hole in the bulk insulation layer of the fourth area to expose a portion of the fourth source/drain region;

forming control gates and a first contact concurrently by forming a third conductive layer on the exposed upper surface of the second conductive layer of each of the first gate stacks to form a control gate of each of the first gate stacks, on the exposed upper surface of the first conductive layer of the second and third gate stacks to form a control gate of each of the second and third gate stacks, and in the first contact hole to form the first contact, wherein the first contact is in electrical contact with the fourth source/drain region, wherein the first gate stacks with the control gates thus formed form a string of series-connected memory cells and second and third gate stacks with the control gates thus formed are respectively first and second select gates;

forming a third dielectric layer overlying the first and second select gates, the memory cells, the first contact, and remaining portions of the bulk insulation layer;

forming a second contact hole through the third dielectric layer and the remaining portion of the bulk insulation layer within the fifth area to expose a portion of the fifth source/drain region;

forming a second contact within the second contact hole, wherein the second contact is in electrical contact with the fifth source/drain region; and forming a fourth conductive layer on the third dielectric layer and the second contact to electrically connect the second contact to the fourth conductive layer.

48. The method of claim 47, wherein the second dielectric layer is selected from the group consisting of one or more layers of dielectric material, tantalum oxide, barium strontium titanate, silicon nitride, and oxide-nitride-oxide.

49. The method of claim 47, wherein the first and second conductive layers are of polysilicon.

50. The method of claim 47, wherein the first dielectric layer is an oxide.

51. The method of claim 47, wherein the third dielectric layer is selected from the group consisting of silicon oxides, TEOS, silicon nitrides, and silicon oxynitrides.

52. The method of claim 47, wherein the fourth conductive layer is a metal layer.

53. The method of claim 47, wherein forming a third conductive layer comprises a blanket deposition of the third conductive layer.

54. The method of claim 47, wherein the bulk insulation layer is selected from the group consisting of doped silicate glass, borosilicate glass, phosphosilicate glass, borophosphosilicate glass, and TEOS.

55. The method of claim 47, wherein the third conductive layer is a metal or metal-containing layer selected from the group consisting of aluminum, copper, refractory metals, refractory metal silicides, and a layer having a metal-containing barrier layer, a metal-containing adhesion layer, and a metal layer.

56. The method of claim 47, wherein the first contact is a source-line contact, the second contact a bit-line contact, and the fourth conductive layer a bit line.

57. The method of claim 47, wherein forming control gates and first and second contacts further comprises removing a portion of the third conductive layer using chemical mechanical planerization.

58. The method of claim 47, wherein forming the third conductive layer comprises chemical vapor deposition or physical vapor deposition.

59. The method of claim 47, wherein
the first dielectric layer of each of the memory cells forms a tunnel dielectric layer;
the first conductive layer of each of the memory cells forms a floating gate layer;
the second dielectric layer of each of the memory cells forms an interlayer dielectric layer; and
the control gate of each memory cell comprises the second conductive layer and the third conductive layer.

60. The method of claim 59, wherein
the first dielectric layer of the first and second select gates forms a gate dielectric layer; and
the control gate of the first and second select gates comprises the first conductive layer and the third conductive layer.

61. The method of claim 47, wherein forming the second contact comprises chemical vapor deposition or physical vapor deposition.

62. A method of forming a NAND memory array, the method comprising:
forming an oxide layer on a semiconductor substrate;
forming a first polysilicon layer on the oxide layer;
forming an interlayer dielectric layer on the first polysilicon layer;
forming a second polysilicon layer on the interlayer dielectric layer;
forming a cap layer on the second polysilicon layer;
removing portions of the cap layer, the second polysilicon layer, the interlayer dielectric layer, the first polysilicon layer, and the oxide layer to form a plurality of areas that expose portions of the semiconductor substrate and define a plurality of first gate stacks disposed between a second gate stack and a third gate stack;
forming a plurality of source/drain regions in the exposed portions of the semiconductor substrate, wherein first source/drain regions of the plurality of source/drain regions connect the first gate stacks in series to form a string of series-connected first gate stacks, wherein a second source/drain region connects the second gate stack to an adjacent first gate stack at a first end of the string and a third source/drain region connects the third gate stack to an adjacent first gate stack at a second end of the string, opposite the first end, and wherein a fourth source/drain region is further connected to the second gate stack and a fifth source/drain region is further connected to the third gate stack;

forming a bulk insulation layer to fill first areas, of the plurality of areas, separating successive first gate stacks and corresponding to the first source/drain regions, a second area, of the plurality of areas, separating the second gate stack and its adjacent first gate stack and corresponding to the second source/drain region, a third area, of the plurality of areas, separating the third gate stack and its adjacent first gate stack and corresponding to the third source/drain region, a fourth area, of the plurality of areas, corresponding to the fourth source/drain region, and a fifth area, of the plurality of areas, corresponding to the fifth source/drain region;

removing portions of the cap layer remaining on each of the first, second, and third gate stacks to expose an upper surface of the second polysilicon layer of each of the first, second, and third gate stacks;

removing the second polysilicon layer and the interlayer dielectric layer of second and third gate stacks to expose an upper surface of the first polysilicon layer of the second and third gate stacks;

forming a mask layer overlying the first, second, and third gate stacks and the bulk insulation layer;

patterning the mask layer to define portions of the bulk insulation layer of the fourth and fifth areas for removal;

removing the portions of the bulk insulation layer of the fourth and fifth areas defined for removal to respectively form first and second contact holes that respectively expose a portion of the fourth and fifth source/drain regions;

removing the mask layer to expose remaining portions of the bulk insulation layer and to re-expose the upper surface of the second polysilicon layer of each of the first gate stacks and the upper surface of the first polysilicon layer of the second and third gate stacks;

forming control gates and first and second contacts concurrently by
blanket depositing a metal or metal-containing layer overlying the remaining portions of the bulk insulation layer, the first, second, and third gate stacks, and the fourth and fifth source/drain regions; and
removing a portion of the metal or metal-containing layer so as to expose the remaining portions of the bulk insulation layer while leaving a portion of the metal or metal-containing layer on the upper surface of the second polysilicon layer of each of the first gate stacks to form a control gate of each of the first gate stacks, on the upper surface of the first polysilicon layer of the second and third gate stacks to form a control gate of each of the second and third gate stacks, and in the first and second contact holes to respectively form the first and second contacts;
wherein the first contact is in electrical contact with the fourth source/drain region and the second contact is in electrical contact with the fifth source/drain region, wherein the first gate stacks with the control gates thus formed form a string of series-connected memory cells and the second and third gate stacks with the control gates thus formed are respectively first and second select gates;

forming a second dielectric layer overlying the first and second select gates, the memory cells, the contacts, and the remaining portions of the bulk insulation layer;

forming a second metal layer on the second dielectric layer; and forming a third contact through the second dielectric layer to electrically connect the second contact to the second metal layer.

63. The method of claim 62, wherein removing the portions of the of the bulk insulation layer of the fourth and fifth areas defined for removal comprises etching.

64. The method of claim 62, wherein the interlayer dielectric layer is selected from the group consisting of one or more layers of dielectric material, tantalum oxide, barium strontium titanate, silicon nitride, and oxide-nitride-oxide.

65. The method of claim 62, wherein the second dielectric layer overlying the first and second select gates, the memory cells, the contacts, and the second remaining portions of the bulk insulation layer is selected from the group consisting of silicon oxides, TEOS, silicon nitrides, and silicon oxynitrides.

66. The method of claim 62, wherein the second metal layer is aluminum.

67. The method of claim 62, wherein the bulk insulation layer is selected from the group consisting of doped silicate glass, borosilicate glass, phosphosilicate glass, borophosphosilicate glass, and TEOS.

68. The method of claim 62, wherein the metal or metal-containing layer is selected from the group consisting of aluminum, copper, refractory metals, refractory metal silicides, and layer having a metal-containing barrier layer, a metal-containing adhesion layer, and a metal layer.

69. The method of claim 62, wherein the first contact is a source-line contact, the second contact a drain-line contact, the third contact a bit-line contact, and the second metal layer a bit line.

70. The method of claim 62, wherein removing the portion of the metal or metal-containing layer comprises using chemical mechanical planerization.

71. The method of claim 62, wherein blanket depositing the metal or metal-containing layer comprises chemical vapor deposition or physical vapor deposition.

72. The method of claim 62, wherein forming a bulk insulation layer comprises forming an upper surface of the bulk insulation layer substantially flush with upper surfaces of the cap layer.

73. The method of claim 72, wherein forming an upper surface of the bulk insulation layer substantially flush with upper surfaces of the cap layer comprises chemical mechanical planerization.

74. The method of claim 62, wherein the cap layer is of a nitride.

75. A method of forming a NAND memory array, the method comprising:
forming an oxide layer on a semiconductor substrate;
forming a first polysilicon layer on the oxide layer;
forming an interlayer dielectric layer on the first polysilicon layer;
forming a second polysilicon layer on the interlayer dielectric layer;
forming a cap layer on the second polysilicon layer;
removing portions of the cap layer, the second polysilicon layer, the interlayer dielectric layer, the first polysilicon layer, and the oxide layer to form a plurality of areas that expose portions of the semiconductor substrate and define a plurality of first gate stacks disposed between a second gate stack and a third gate stack;

forming a plurality of source/drain regions in the exposed portions of the semiconductor substrate, wherein first source/drain regions of the plurality of source/drain regions connect the first gate stacks in series to form a string of series-connected first gate stacks, wherein a second source/drain region connects the second gate stack to an adjacent first gate stack at a first end of the string and a third source/drain region connects the third gate stack to an adjacent first gate stack at a second end of the string, opposite the first end, and wherein a fourth source/drain region is further connected to the second gate stack and a fifth source/drain region is further connected to the third gate stack;

forming a bulk insulation layer to fill first areas, of the plurality of areas, separating successive first gate stacks and corresponding to the first source/drain regions, a second area, of the plurality of areas, separating the second gate stack and its adjacent first gate stack and corresponding to the second source/drain region, a third area, of the plurality of areas, separating the third gate stack and its adjacent first gate stack and corresponding to the third source/drain region, a fourth area, of the plurality of areas, corresponding to the fourth source/drain region, and a fifth area, of the plurality of areas, corresponding to the fifth source/drain region;

removing portions of the cap layer remaining on each of the first, second, and third gate stacks to expose an upper surface of the second polysilicon layer of each of the first, second, and third gate stacks;

removing the second polysilicon layer and the interlayer dielectric layer of second and third gate stacks to expose an upper surface of the first polysilicon layer of the second and third gate stacks;

forming a mask layer overlying the first, second, and third gate stacks and the bulk insulation layer;

patterning the mask layer to define portions of the bulk insulation layer of the fourth area for removal;

removing the portions of the of the bulk insulation layer of the fourth area defined for removal to form a first contact hole that exposes a portion of the fourth and source/drain region;

removing the mask layer to expose remaining portions of the bulk insulation layer and to re-expose the upper surface of the second polysilicon layer of each of the first gate stacks and the upper surface of the first polysilicon layer of the second and third gate stacks;

forming control gates and a first contact concurrently by
blanket depositing a metal or metal-containing layer overlying the remaining portions of the bulk insulation layer, the first, second, and third gate stacks, and the fourth source/drain region; and removing a portion of the metal or metal-containing layer so as to expose the remaining portions of the bulk insulation layer while leaving a portion of the metal or metal-containing layer on the upper surface of the second polysilicon layer of each of the first gate stacks to form a control gate of each of the first gate stacks, on the upper surface of the first polysilicon layer of the second and third gate stacks to form a control gate of each of the second and third gate stacks, and in the first contact hole to form the first contact;

wherein the first contact is in electrical contact with the fourth source/drain region, wherein the first gate stacks with the control gates thus formed form a string of series-connected memory cells and the second and third gate stacks with the control gates thus formed are respectively first and second select gates;

forming a second dielectric layer overlying the first and second select gates, the memory cells, the first contact, and the remaining portions of the bulk insulation layer;

forming a second contact hole through the second dielectric layer and the remaining portion of the bulk insulation layer within the fifth area to expose a portion of the fifth source/drain region;

forming a second contact within the second contact hole, wherein the second contact is in electrical contact with the fifth source/drain region; and forming a second metal layer on the second dielectric layer and the second contact so that the second contact is electrically connected to the second metal layer.

76. The method of claim 75, wherein removing the portions of the of the bulk insulation layer of the fourth and fifth areas defined for removal comprises etching.

77. The method of claim 75, wherein the interlayer dielectric layer is selected from the group consisting of one or more layers of dielectric material, tantalum oxide, barium strontium titanate, silicon nitride, and oxide-nitride-oxide.

78. The method of claim 75, wherein the second dielectric layer overlying the first and second select gates, the memory cells, the first contact, and the second remaining portions of the bulk insulation layer is selected from the group consisting of silicon oxides, TEOS, silicon nitrides, and silicon oxynitrides.

79. The method of claim 75, wherein the second metal layer is aluminum.

80. The method of claim 75, wherein the bulk insulation layer is selected from the group consisting of doped silicate glass, borosilicate glass, phosphosilicate glass, borophosphosilicate glass, and TEOS.

81. The method of claim 75, wherein the metal or metal-containing layer is selected from the group consisting of aluminum, copper, refractory metals, refractory metal silicides, and layer having a metal-containing barrier layer, a metal-containing adhesion layer, and a metal layer.

82. The method of claim 75, wherein the first contact is a source-line contact, the second contact a bit-line contact, and the second metal layer a bit line.

83. The method of claim 75, wherein removing the portion of the metal or metal-containing layer comprises using chemical mechanical planerization.

84. The method of claim 75, wherein blanket depositing the metal or metal-containing layer comprises chemical vapor deposition or physical vapor deposition.

85. The method of claim 75, wherein forming a bulk insulation layer comprises forming an upper surface of the bulk insulation layer substantially flush with upper surfaces of the cap layer.

86. A method of forming a memory array, comprising:
forming gate stacks on a substrate;
forming a bulk insulation layer in areas separating the gate stacks;
removing a cap layer formed on the gate stacks to expose an upper surface of a first conductive layer of each of the gate stacks;
forming a first contact hole in the bulk insulation layer in a first area of the areas separating the gate stacks to expose a drain region, formed in the substrate, shared by adjacent gate stacks and a second contact hole in the bulk insulation layer in a second area of the areas separating the gate stacks to expose a source region, formed in the substrate, shared by adjacent gate stacks; and forming control gates and first and second contacts concurrently by forming a second conductive layer on the exposed upper surface of the first conductive layer of each of the gate stacks to form control gates of the gate stacks and in the first and second contact holes to respectively form the first and second contacts, wherein the first contact is in electrical contact with the drain region and the second contact is in electrical contact with the source region;

wherein the gate stacks with the control gates thus formed are memory cells.

87. The method of claim 86, wherein forming a second conductive layer comprises a blanket deposition of the second conductive layer.

88. The method of claim 86, wherein the bulk insulation layer is selected from the group consisting of doped silicate glass, borosilicate glass, phosphosilicate glass, borophosphosilicate glass, and TEOS.

89. The method of claim 86, wherein the second conductive layer is a metal or metal-containing layer selected from the group consisting of aluminum, copper, refractory metals, refractory metal silicides, and a layer having a metal-containing barrier layer, a metal-containing adhesion layer, and a metal layer.

90. The method of claim 86 further comprises forming a third contact electrically connected between the first contact and a third conductive layer.

91. The method of claim 90, wherein the third contact is a bit-line contact, the first contact is a drain-line contact, and the third conductive layer is a bit line, and wherein the bit-line contact electrically connects the drain-line contact to the bit line and thus the drain region to the bit line.

92. A method of forming a memory device, the method comprising:
    forming a first dielectric layer on first and second portions of a semiconductor substrate;
    forming a first conductive layer on the first dielectric layer;
    forming a second dielectric layer on the first conductive layer;
    forming a second conductive layer on the second dielectric layer;
    forming a cap layer on the second conductive layer;
    removing portions of the cap layer, the second conductive layer, the second dielectric layer, the first conductive layer, and the first dielectric layer to form a plurality of areas that expose portions of the first and second portions of the semiconductor substrate and define a plurality of first gate stacks on the first portion of the semiconductor substrate and a second gate stack on the second portion of the semiconductor substrate;
    forming drain regions in first portions of the exposed portions of the semiconductor substrate in the first portion of the semiconductor substrate, wherein each drain region is shared by a pair of adjacent first gate stacks;
    forming source regions in second portions of the exposed portions of the semiconductor substrate in the first portion of the semiconductor substrate, wherein each source region is shared by a pair of adjacent first gate stacks;
    forming a bulk insulation layer to fill first areas, of the plurality of areas, corresponding to the first portions of the exposed portions in the first portion of the semiconductor substrate, second areas, of the plurality of areas, corresponding to the second portions of the exposed portions in the first portion of the semiconductor substrate, and third areas, of the plurality of areas, corresponding to the exposed portions in the second portion of the semiconductor substrate;
    removing portions of the cap layer remaining on each of the first gate stacks and on the second gate stack to expose an upper surface of the second conductive layer of each of the first gate stacks and the second gate stack;
    removing the second conductive layer and the second dielectric layer of the second gate stack to expose an upper surface of the first conductive layer of the second gate stack;
    forming first contact holes in the bulk insulation layer of the first areas to expose each of the drain regions and second contact holes in the bulk insulation layer of the second areas to expose each of the source regions;
    forming control gates, first contacts, and second contacts concurrently by forming a third conductive layer on the exposed upper surface of the second conductive layer of each of the first gate stacks to form a control gate of each of the first gate stacks, on the exposed upper surface of the first conductive layer of the second gate stack to form a control gate of the second gate stack, and in the first contact holes and the second contact holes to respectively form the first contacts and the second contacts, wherein first contacts are respectively in electrical contact with the drain regions and the second contacts are respectively in electrical contact with the source regions, wherein the first gate stacks with the control gates thus formed form memory cells on the first portion of the semiconductor substrate and the second gate stack with the control gate thus formed is an active element on the second portion of the semiconductor substrate;
    forming a third dielectric layer overlying at least the memory cells and remaining portions of the bulk insulation layer on the first portion of the semiconductor substrate;
    forming a fourth conductive layer on the third dielectric layer; and
    forming third contacts through the third dielectric layer to respectively electrically connect the first contacts to the fourth conductive layer.

93. The method of claim 92, wherein the second dielectric layer is selected from the group consisting of one or more layers of dielectric material, tantalum oxide, barium strontium titanate, silicon nitride, and oxide-nitride-oxide.

94. The method of claim 92, wherein the first and second conductive layers are of polysilicon.

95. The method of claim 92, wherein the first dielectric layer is an oxide.

96. The method of claim 92, wherein the third dielectric layer is selected from the group consisting of silicon oxides, TEOS, silicon nitrides, and silicon oxynitrides.

97. The method of claim 92, wherein the third conductive layer is metal.

98. The method of claim 92, wherein forming a third conductive layer comprises a blanket deposition of the third conductive layer.

99. The method of claim 92, wherein the bulk insulation layer is selected from the group consisting of doped silicate glass, borosilicate glass, phosphosilicate glass, borophosphosilicate glass, and TEOS.

100. The method of claim 92, wherein the third conductive metal or metal-containing layer selected from the group consisting of aluminum, copper, refractory metals, refractory metal silicides, and a layer having a metal-containing barrier layer, a metal-containing adhesion layer, and a metal layer.

101. The method of claim 92, wherein forming control gates and first and second contacts further comprises removing a portion of the third conductive layer using chemical mechanical planerization.

102. The method of claim 92, wherein forming the third conductive layer comprises chemical vapor deposition or physical vapor deposition.

103. The method of claim 92, wherein
the first dielectric layer of each of the memory cells forms a tunnel dielectric layer;
the first conductive layer of each of the memory cells forms a floating gate layer;
the second dielectric layer of each of the memory cells forms an interlayer dielectric layer; and
the control gate of each memory cell comprises the second conductive layer and the third conductive layer.

104. The method of claim 103, wherein
the first dielectric layer of the active element forms a gate dielectric layer; and
the control gate of the active element comprises the first conductive layer and the third conductive layer.

105. The method of claim 92 further comprises:
forming source/drain regions the exposed portions in the second portion of the semiconductor substrate before forming the bulk insulation layer;
forming a third contact hole in the bulk insulation layer of at least one of the third areas to expose at least one of the source/drain regions before forming the control gates and the first and second contacts; and
forming a fourth contact in the third contact hole concurrently with forming the control gates and the first and second contacts from the third conductive layer.

106. The method of claim 92, wherein the active element is a field-effect transistor.

107. A method of forming a memory device, the method comprising:
forming an oxide layer on first and second portions of a semiconductor substrate;
forming a first polysilicon layer on the oxide layer;
forming an interlayer dielectric layer on the first polysilicon layer;
forming a second polysilicon layer on the interlayer dielectric layer;
forming a cap layer on the second polysilicon layer;
removing portions of the cap layer, the second polysilicon layer, the interlayer dielectric layer, the first polysilicon layer, and the oxide layer to form a plurality of areas that expose portions of the first and second portions of the semiconductor substrate and define a plurality of first gate stacks on the first portion of the semiconductor substrate and a second gate stack on the second portion of the semiconductor substrate;
forming drain regions in first portions of the exposed portions of the semiconductor substrate in the first portion of the semiconductor substrate, wherein each drain region is shared by a pair of adjacent first gate stacks;
forming source regions in second portions of the exposed portions of the semiconductor substrate in the first portion of the semiconductor substrate, wherein each source region is shared by a pair of adjacent first gate stacks;
forming source/drain regions in the exposed portions in the second portion of the semiconductor substrate;
forming a bulk insulation layer to fill first areas, of the plurality of areas, corresponding to the first portions of the exposed portions in the first portion of the semiconductor substrate, second areas, of the plurality of areas, corresponding to the second portions of the exposed portions in the first portion of the semiconductor substrate, and third areas, of the plurality of areas, corresponding to the exposed portions in the second portion of the semiconductor substrate;
removing portions of the cap layer remaining on each of the first gate stacks and on the second gate stack to expose an upper surface of the second polysilicon layer of each of the first gate stacks and the second gate stack;
removing the second polysilicon layer and the interlayer dielectric layer of the second gate stack to expose an upper surface of the first polysilicon layer of the second gate stack;
forming a mask layer overlying the first gate stacks, the second gate stack, and the bulk insulation layer of the first, second, and third areas;
patterning the mask layer to define portions of the bulk insulation layer of the first and second areas and at least one of the third areas for removal;
removing the portions of the bulk insulation layer of the first areas defined for removal to form first contact holes that expose the drain regions in the first portion of the semiconductor substrate, the second areas defined for removal to form second contact holes that expose the source regions in the first portion of the semiconductor substrate, and the at least one of the third areas defined for removal to form at least one third contact hole that exposes at least one source/drain region in the second portion of the semiconductor substrate;
removing the mask layer to expose remaining portions of the bulk insulation layer and to re-expose the upper surface of the second polysilicon layer of each of the first stacks and the upper surface of the first polysilicon layer of the second gate stack;
forming control gates, first contacts, second contacts, and at least one third contact concurrently by
blanket depositing a metal or metal-containing layer overlying the remaining portions of the bulk insulation layer, the first gate stacks, the second gate stack, the drain regions in the first portion of the semiconductor substrate, the source regions in the first portion of the semiconductor substrate, and the at least one of the source/drain regions in the second portion of the semiconductor substrate; and
removing a portion of the metal or metal-containing layer so as to expose the remaining portions of the bulk insulation layer while leaving a portion of the metal or metal-containing layer on the upper surface of the second polysilicon layer of each of the first gate stacks to form a control gate of each of the first gate stacks, on the upper surface of the first polysilicon layer of the second gate stack to form a control gate of the second gate stack, and in the first contact holes, the second contact holes, and the at least one third contact hole to respectively form the first contacts, the second contacts, and the at least one third contact;
wherein the first contacts are respectively in electrical contact with the drain regions, the second contacts are respectively in electrical contact with the source regions, the at least one third contact in electrical contact with the at least one of the source/drain regions, wherein the first gate stacks with the control gates thus formed form memory cells on the first portion of the semiconductor substrate and the second gate stack with the control gate thus formed is an active element on the second portion of the semiconductor substrate;

forming a second dielectric layer overlying the active element, the memory cells, the contacts, and the remaining portions of the bulk insulation layer;

forming a second metal layer on the second dielectric layer; and forming fourth contacts through the second dielectric layer to respectively electrically connect the first contacts to the second metal layer.

108. The method of claim 107, wherein removing the portions of the bulk insulation layer of the first and second areas and at least one of the third areas defined for removal comprises etching.

109. The method of claim 107, wherein the interlayer dielectric layer is selected from the group consisting of one or more layers of dielectric material, tantalum oxide, barium strontium titanate, silicon nitride, and oxide-nitride-oxide.

110. The method of claim 107, wherein the second dielectric layer overlying the active element, the memory cells, the contacts, and the second remaining portions of the bulk insulation layer is selected from the group consisting of silicon oxides, TEOS, silicon nitrides, and silicon oxynitrides.

111. The method of claim 107, wherein the second metal layer is aluminum.

112. The method of claim 107, wherein the bulk insulation layer is selected from the group consisting of doped silicate glass, borosilicate glass, phosphosilicate glass, borophosphosilicate glass, and TEOS.

113. The method of claim 107, wherein the metal or metal-containing layer is selected from the group consisting of aluminum, copper, refractory metals, refractory metal silicides, and a layer having a metal-containing barrier layer, a metal-containing adhesion layer, and a metal layer.

114. The method of claim 107, wherein the first contacts are drain-line contacts, the second contacts source contacts, the fourth contacts bit-line contacts, and the second metal layer a bit line.

115. The method of claim 107, wherein removing the portion of the metal or metal-containing layer comprises using chemical mechanical planerization.

116. The method of claim 107, wherein blanket depositing the metal or metal-containing layer comprises chemical vapor deposition or physical vapor deposition.

117. The method of claim 107, wherein forming a bulk insulation layer comprises forming an upper surface of the bulk insulation layer substantially flush with upper surfaces of the cap layer.

118. The method of claim 117, wherein forming an upper surface of the bulk insulation layer substantially flush with upper surfaces of the cap layer comprises chemical mechanical planerization.

119. The method of claim 107, wherein the cap layer is of nitride.

* * * * *